(12) United States Patent
Janssens et al.

(10) Patent No.: US 11,177,117 B2
(45) Date of Patent: Nov. 16, 2021

(54) METHOD FOR PULSED LASER DEPOSITION

(71) Applicant: Solmates B.V., Enschede (NL)

(72) Inventors: Jan Arnaud Janssens, Schalkhaar (NL); Jan Matthijn Dekkers, Aadorp (NL); Kristiaan Hendrikus Aloysius Böhm, Deventer (NL); Jeroen Aaldert Heuver, Enschede (NL)

(73) Assignee: Solmates B.V., Enschede (NL)

( * ) Notice: Subject to any disclaimer, the term of this patent is extended or adjusted under 35 U.S.C. 154(b) by 113 days.

(21) Appl. No.: 16/298,187

(22) Filed: Mar. 11, 2019

(65) Prior Publication Data

US 2019/0279847 A1 Sep. 12, 2019

(30) Foreign Application Priority Data

Mar. 12, 2018 (EP) .................................. 18161161.7

(51) Int. Cl.
*C23C 14/00* (2006.01)
*H01J 37/32* (2006.01)
*C23C 14/28* (2006.01)

(52) U.S. Cl.
CPC ........ *H01J 37/32339* (2013.01); *C23C 14/28* (2013.01); *H01J 2237/06* (2013.01); *H01J 2237/332* (2013.01)

(58) Field of Classification Search
CPC ........... B23K 26/00; C23C 14/00; H01J 37/00
See application file for complete search history.

(56) References Cited

U.S. PATENT DOCUMENTS

| 4,987,286 | A | * | 1/1991 | Allen | B08B 7/0042 |
| | | | | | 219/121.6 |
| 5,049,405 | A | | 9/1991 | Cheung | |
| 5,257,706 | A | * | 11/1993 | McIntyre | B23K 26/16 |
| | | | | | 219/121.61 |
| 5,290,761 | A | | 3/1994 | Keating et al. | |
| 5,660,746 | A | | 8/1997 | Witanachchi et al. | |
| 5,760,366 | A | * | 6/1998 | Haruta | C23C 14/22 |
| | | | | | 219/121.68 |
| 8,828,506 | B2 | | 9/2014 | Ruuttu et al. | |
| 9,074,282 | B2 | | 7/2015 | Janssens et al. | |
| 2004/0035360 | A1 | * | 2/2004 | Yamazaki | H01L 21/67276 |
| | | | | | 118/715 |

FOREIGN PATENT DOCUMENTS

| EP | 2159300 B1 | 12/2011 |
| EP | 2137336 B1 | 4/2014 |
| JP | 3246129 A | 9/1996 |
| WO | 9409518 A1 | 4/1994 |

* cited by examiner

*Primary Examiner* — Gordon Baldwin
*Assistant Examiner* — Mohammad Mayy
(74) *Attorney, Agent, or Firm* — The Webb Law Firm

(57) ABSTRACT

The invention relates to a method for pulsed laser deposition including the steps of: providing a target and a substrate facing the target; irradiating a spot on the target with a pulsed laser beam to generate a plasma plume of target material and depositing the plasma plume on the substrate; and smoothing the surface structure of the spot on the target prior to irradiating the spot with a pulsed laser beam.

15 Claims, 2 Drawing Sheets

METHOD FOR PULSED LASER DEPOSITION

CROSS-REFERENCE TO RELATED APPLICATIONS

This application claims priority to European Patent Application No. 18161161.7 filed Mar. 12, 2018, the disclosure of which is hereby incorporated by reference in its entirety.

BACKGROUND OF THE INVENTION

Field of the Invention

The invention relates to a method for pulsed laser deposition, comprising the steps of: providing a target and a substrate facing the target; irradiating a spot on the target with a pulsed laser beam to generate a plasma plume of target material and depositing the plasma plume on the substrate.

Technical Considerations

Such a method is for example known from EP 2159300. In this publication a method is described in which a target material can be deposited on a large substrate surface. To this end, the plasma plume generated by irradiating the target is moved over the substrate, such that the plasma is deposited over the whole surface of the substrate.

In order to reduce the wear of the target material, the laser beam is moved over the target material, such that the full surface of the target material is used to generate a plasma plume and wear of the target is distributed evenly over the surface of the target.

However, when a plasma plume is generated on a spot on the target, the surface structure of this particular spot is roughened and when this spot is used a second time to generate a plasma plume, the characteristics of the plasma plume will be different from the first time.

After a first plasma plume is generated, the generated heat will cause cracks in the surface of the target. These cracks can grow after repeated heat by irradiation with the laser beam and could lead to parts of the target material breaking loose, instead of being transformed into a plasma plume. These loose particles will deteriorate the deposition on the substrate.

Also, when a plasma plume is generated, the surface of the target material will not be ablated evenly. This unevenness will distort a second generated plasma plume and could lead to deviations in the direction of the plasma plume being directed to the substrate. Especially, when large substrate surfaces are to be provided with target material, the directional deviations will cause unevenness in the deposited layer.

Finally, after a first plasma plume is generated droplets of target material can adhere to the surface of the spot, which droplets will get loose on the second plasma plume being generated on the same spot. These loose droplets will be taken along with the second plasma plume and will contaminate the deposited layer.

U.S. Pat. No. 5,660,746 discloses a method wherein a spot on a target material is first heated such that the target material melts, after which and without movement of the target, the same spot is irradiated by a pulsed laser to generate a plasma plume. The target material is in fact used in liquid form during the pulsed laser deposition. The advantage of using the target material in liquid state is that cracks cannot be present and that the surface is substantially flat due to the liquid state of the target material.

As the melt phase of the target material is very short, the laser beam pulse for melting the target material and the laser beam pulse for irradiating the target material to generate a plasma plume need to follow each other within a few dozen nanoseconds. The timing of these subsequent laser beam pulses is already extremely difficult, while the intensity of the melting beam and the irradiation beam should also be controlled correctly.

And the complexity of control would further be increased when the target moves or rotates and when the pulse frequency of the laser beam is to be varied.

When this method would be applied to a moving or rotating target, it would not function, as the pulsed laser for melting the target and the pulsed laser for generating the plasma plume are directed at the same location. So, with a moving or rotating target, the melted part of the target would be moved out, before the laser for creating the plasma plume is fired.

Accordingly it is an object of the invention to reduce or even remove the above mentioned disadvantages.

SUMMARY OF THE INVENTION

This object is achieved according to the invention with a method characterized by smoothing the surface structure of the spot on the target prior to irradiating the spot with a pulsed laser beam.

With the invention, the surface structure of the spot on the target is prepared by a smoothing step. When the surface structure is smoothed a plasma plume can be generated by irradiating the smoothed spot with the laser beam.

The advantage of the invention is that each pulse of the laser beam can be directed onto a spot of the target material having a smooth surface structure, without cracks and droplets, such that the generated plasma plume is for each pulse of similar quality resulting in a deposit layer of high quality.

Although it is preferred to have a smoothing step per plasma plume generation step, it can also be sufficient to have a smoothing step per a number of plasma plume generation steps. This could for example be dependent on the material type of the target and the deterioration rate of the surface structure.

A preferred embodiment of the method according to the invention further comprises the step of moving the target with the smoothed spot under the pulsed laser beam for the smoothed spot to be irradiated.

By moving the smoothed spot under the pulsed laser beam, it is possible to have the smoothing step and the irradiating step spaced apart.

In a preferred embodiment of the method according to the invention the smoothing step comprises a heating step, wherein at least an upper layer of the surface structure of the spot is melted with an energy beam, such as a laser beam, wherein the energy of the energy beam is below the plasma generation threshold.

By melting the upper layer of the surface structure of the spot, any irregularities and any cracks are smoothed and an optimal surface structure is obtained to be irradiated by the pulsed laser beam and to generate a plasma plume.

The energy of the energy beam with which the upper layer of the spot is melted must be lower than the energy required to generate a plasma, as otherwise a premature plasma plume is generated and the surface structure would not be smoothed.

Explicitly disclaimed is the method according to U.S. Pat. No. 5,660,746 wherein a spot on a target material is first heated such that the target material melts, after which and without movement of the target, the same spot is irradiated by a pulsed laser to generate a plasma plume.

In a further embodiment of the method according to the invention at least the upper layer is allowed to solidify before the spot is irradiated with the pulsed laser beam.

The movement of the smoothed spot towards the position at which the spot is irradiated provides time for the liquid target material to solidify again and depending on the material to crystallize. The solidified spot on the target material has obtained a smooth surface structure, which allows an optimal plasma plume generation and deposition of material on the substrate.

In another preferred embodiment of the method according to the invention the smoothing step comprises a particle bombardment treatment of the surface structure of the spot on the target in order to remove adhering particles.

The particle bombardment can be provided with for example an ion beam, electron beam or photon beam. The particle bombardment will hit the adhering particles from the target material. As the position of the smoothing step does not coincide with the step at which the plasma plume is generated, the substrate can be shielded off when the smoothing is performed with the particle bombardment and the removed particles can be captured by for example a shield, such that they do not influence the substrate.

Preferably, the particle bombardment treatment step and the heat treatment are executed one after the other or could be combined in a single step. This allows for the removal of adhering particles and for the removal of any further surface irregularities and cracks, such that an optimally smoothed surface structure of the spot on the target is obtained, which can then be irradiated with the pulsed laser beam.

In yet another embodiment of the method according to the invention, after the smoothing step, the target is moved to position the spot of the target with the smoothed surface structure under the incident pulsed laser beam.

This allows for the smoothing step to be applied to the target at another position than where the laser beam is irradiated on the target. An advantage thereof is that any debris or lose particles originating from the smoothing step can be captured or filtered, such that the true depositing process is not influenced.

In yet a further preferred embodiment of the method according to the invention the target is moved, for example rotated or translated, and the displacement speed of the target, the smoothing of the spot on the target and the irradiating of the spot is controlled such that the smoothed spot of the target arrives at the moment the pulsed laser irradiates the target.

This allows for a coordinated and space apart positions for executing the smoothing step and the irradiating step.

Preferably, the smoothing step is repeated after one or more irradiating steps for the same spot on the target.

BRIEF DESCRIPTION OF THE DRAWINGS

These and other features of the invention will be elucidated in conjunction with the accompanying drawings.

DESCRIPTION OF THE INVENTION

Figure 1:
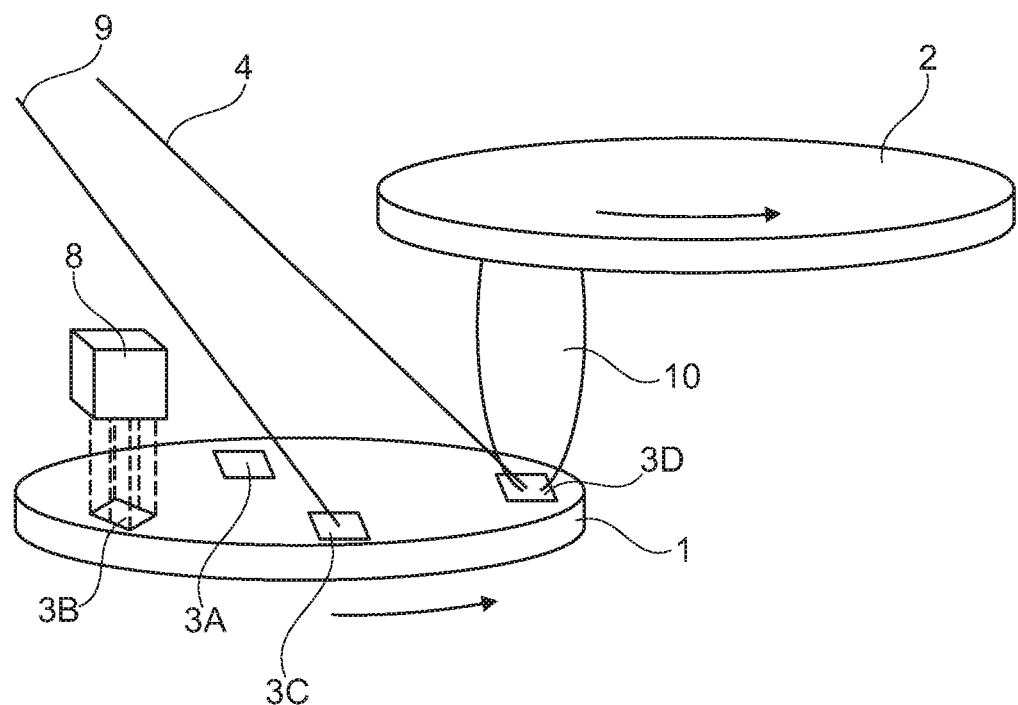
FIG. 1 shows a schematic view of an embodiment of the method according to the invention.

FIG. 1 shows a disc of target material 1, which is rotated at a desired rotational speed. Above and partially overlapping, when seen in the direction of the rotation axis, is a substrate 2 arranged, which is also rotated, such that the full surface of the substrate can be provided with a layer of target material.

FIG. 1 shows the same spot 3 on the target 1 after different time intervals. The different time intervals of the same spot 3 have been indicated with the letters A-D.

Figure 2A:
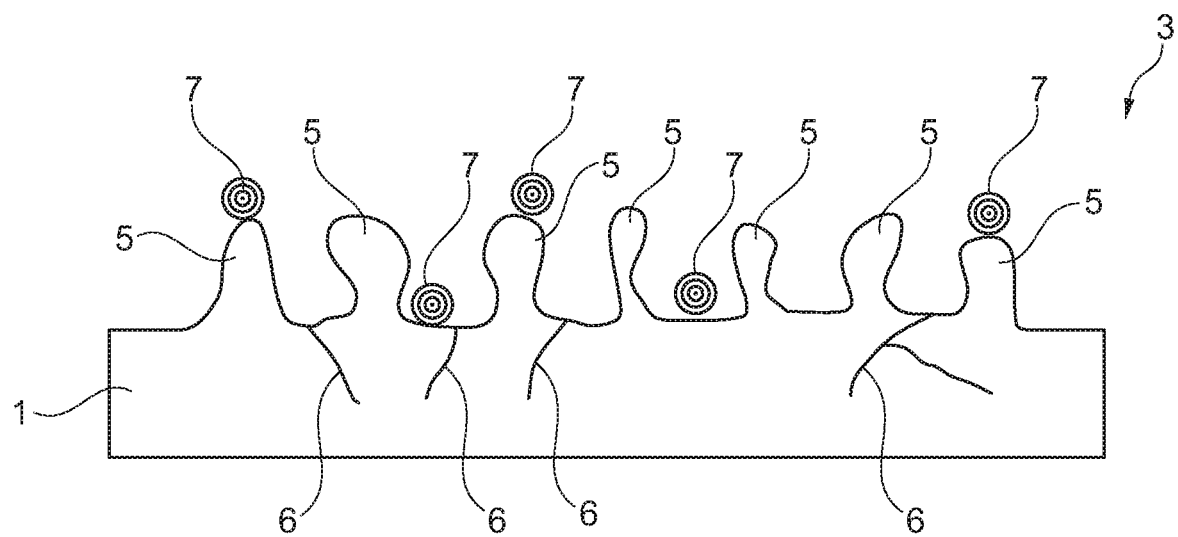
FIGS. 2A-2D show enlarged cross sectional views of the surface structure of the target in different stages of the method according to the invention.

The spot 3A has been ablated by a previous irradiation by a laser beam 4 and has a surface structure as depicted in FIG. 2A. The spot 3A has a surface structure with a number of cones 5, cracks 6 and adhered particles 7.

Due to the rotation of the target 1, the spot 3 is positioned underneath a particle bombardment device 8, such as an ion beam, electron beam or photon beam, which fires a plurality of particles onto the surface of the spot 3 to remove the particles 7.

Figure 2B:
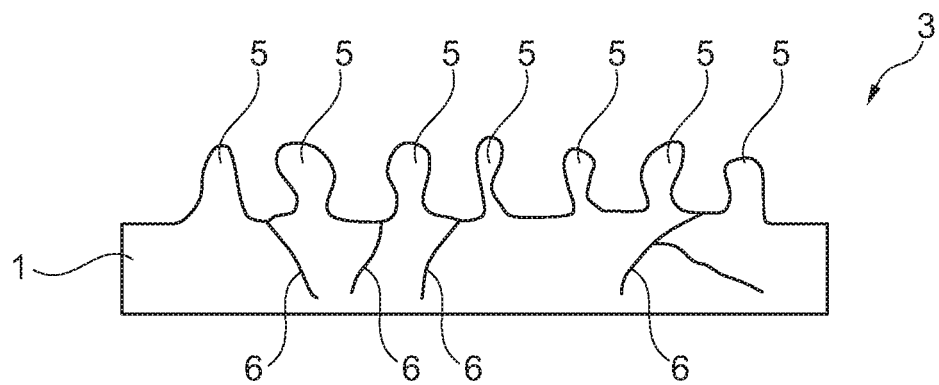

As depicted in FIG. 2B, the spot 3 has been cleaned from the adhered particles 7, but still has the cones 5 and cracks 6.

Figure 2C:
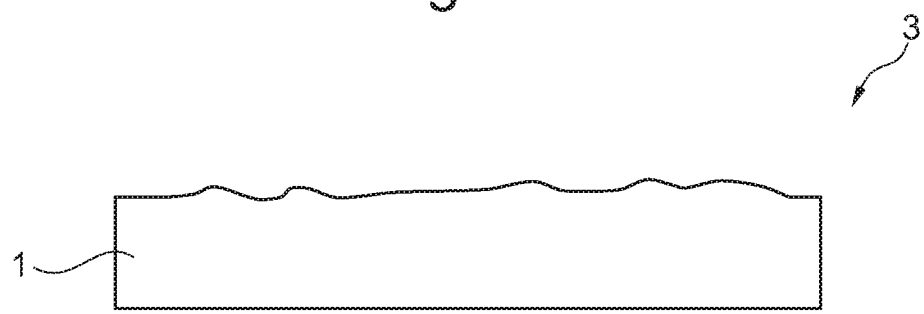

By further rotation of the target 1, the spot 3 is positioned underneath a second pulsed laser beam 9 or other means to heat the target material of the spot 3, such that at least an upper layer of the surface structure of the spot 3 is melted. After solidification, the spot 3 has a smooth surface structure without cones 5 or cracks 6, as is depicted in FIG. 2C.

Figure 2D:
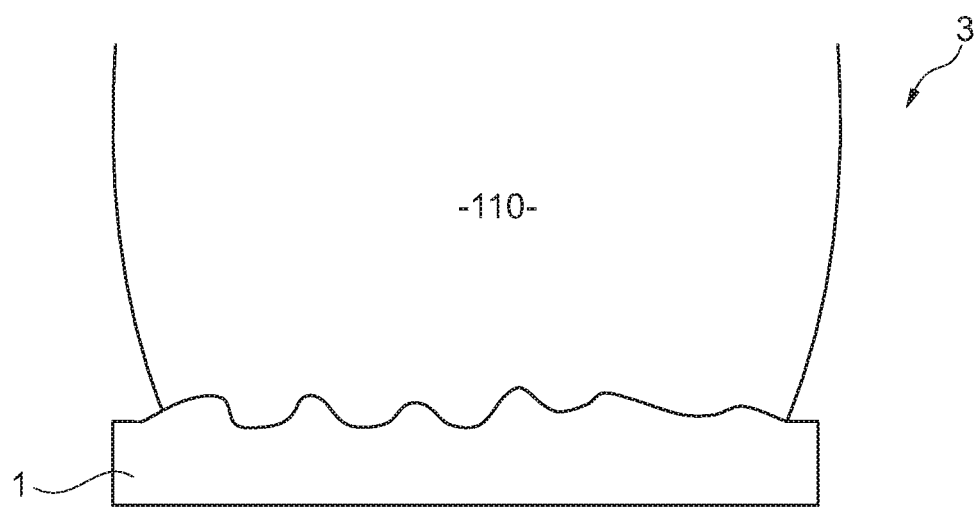

Then finally, the spot 3 is moved further by rotation of the target 1 underneath the pulsed laser 4, such that a plasma plume 10 is generated by the irradiation of the pulsed laser 4 on the target 1 at the zone 3. As can be seen in FIG. 2D, the generation of the plasma plume 10 makes the surface structure irregular again up to the structure as depicted in FIG. 2A. Be repeating the smoothing steps the surface structure of zone 3 can be smoothed again.

The invention claimed is:

1. A method for pulsed laser deposition, comprising:
providing a target and a substrate facing the target;
irradiating at a first location a spot on the target with a pulsed laser beam to generate a plasma plume of target material and depositing the plasma plume on the substrate; and
smoothing at a second location a surface structure of the spot on the target prior to irradiating the spot with a pulsed laser beam at the first location, wherein the spot on the target is moved between the second and first locations by rotation and/or translation of the target, wherein a displacement speed of the spot on the target between the second and first locations, the smoothing of the spot on the target at the second location, and the irradiating of the spot at the first location is controlled such that the smoothed spot of the target arrives at the first location at the moment the pulsed laser irradiates the target, wherein the smoothing step comprises a heating step, wherein at least an upper layer of the surface structure of the spot is melted with an energy beam, and wherein energy of the energy beam is below a plasma generation threshold, wherein the smoothing step at the second location is repeated after one or more irradiating steps at the first location for the same spot on the target.

2. The method according to claim 1, wherein at least the upper layer is allowed to solidify before the spot is irradiated with the pulsed laser beam.

3. The method according to claim 2, wherein the smoothing step comprises a particle bombardment treatment of the surface structure of the spot on the target in order to remove adhering particles.

4. The method according to claim 1, wherein the smoothing step comprises a particle bombardment treatment of the surface structure of the spot on the target in order to remove adhering particles.

5. The method according to claim 4, wherein the particle bombardment treatment step and the heating step are executed one after the other at different parts of the second location.

6. The method according to claim 4, wherein after the smoothing step at the second location, the spot on the target is moved from the second location to the first location to position the spot of the target with the smoothed surface structure under the incident pulsed laser beam.

7. The method according to claim 1, wherein after the smoothing step at the second location, the spot on the target is moved from the second location to the first location to position the spot of the target with the smoothed surface structure under the incident pulsed laser beam.

8. The method according to claim 1, wherein the energy beam comprises a laser beam.

9. A method for pulsed laser deposition, comprising:
providing a target and a substrate facing the target;
irradiating at a first location a spot on the target with a pulsed laser beam to generate a plasma plume of target material and depositing the plasma plume on the substrate;
smoothing at a second location a surface structure of the spot on the target prior to irradiating the spot with a pulsed laser beam at the first location; and
moving by rotation and/or translation of the target the smoothed spot from the second location to the first location under the pulsed laser beam for the smoothed spot to be irradiated, wherein the smoothing step comprises a heating step, wherein at least an upper layer of the surface structure of the spot is melted with an energy beam, and wherein energy of the energy beam is below a plasma generation threshold, wherein the smoothing step at the second location is repeated after one or more irradiating steps at the first location for the same spot on the target.

10. The method according to claim 9, wherein the smoothing step comprises a heating step, wherein at least an upper layer of the surface structure of the spot is melted with an energy beam wherein energy of the energy beam is below a plasma generation threshold.

11. The method according to claim 10, wherein at least the upper layer is allowed to solidify before the spot is irradiated with the pulsed laser beam.

12. The method according to claim 9, wherein the smoothing step comprises a particle bombardment treatment of the surface structure of the spot on the target in order to remove adhering particles.

13. The method according to claim 9, wherein after the smoothing step at the second location, the spot on the target is moved from the second location to the first location to position the spot of the target with the smoothed surface structure under the incident pulsed laser beam.

14. The method according to claim 9, wherein the target is moved between the second and first locations and wherein a displacement speed of the spot on the target between the second and first locations, the smoothing of the spot on the target at the second location, and the irradiating of the spot at the first location is controlled such that the smoothed spot of the target arrives at the first location at the moment the pulsed laser irradiates the target.

15. The method according to claim 9, wherein the smoothing step at the second location is repeated after one or more irradiating steps at the first location for the same spot on the target.

* * * * *